United States Patent
Kwon et al.

(10) Patent No.: US 7,255,802 B2
(45) Date of Patent: Aug. 14, 2007

(54) TAPE SUBSTRATE AND METHOD FOR FABRICATING THE SAME

(75) Inventors: Soon Bog Kwon, Kyungki-do (KR); Sang Hun Lee, Kyungki-do (KR); Yang Sik Moon, Seoul (KR); Ki Pyo Hong, Pusan (KR); Yoon Kuen Cho, Kyungsangbuk-do (KR)

(73) Assignees: LG Electronics Inc., Seoul (KR); LG Micron Co., Ltd., Kumi-si (KR)

( * ) Notice: Subject to any disclaimer, the term of this patent is extended or adjusted under 35 U.S.C. 154(b) by 0 days.

(21) Appl. No.: 11/023,162

(22) Filed: Dec. 28, 2004

(65) Prior Publication Data

US 2005/0109631 A1    May 26, 2005

Related U.S. Application Data

(62) Division of application No. 10/724,219, filed on Dec. 1, 2003, now Pat. No. 7,180,006.

(30) Foreign Application Priority Data

Dec. 2, 2002    (KR) .................... 10-2002-0075984

(51) Int. Cl.
   H01B 13/00    (2006.01)
   H05K 3/00    (2006.01)
(52) U.S. Cl. .................... 216/13; 216/41; 29/846; 29/849; 427/98; 174/250; 174/262
(58) Field of Classification Search ................ 216/13, 216/41; 174/250, 262; 29/846, 849; 427/98
   See application file for complete search history.

(56) References Cited

U.S. PATENT DOCUMENTS

2004/0161626 A1 *    8/2004    Kwon et al. ................ 428/577

FOREIGN PATENT DOCUMENTS

JP    2002289653 A  *  10/2002

* cited by examiner

*Primary Examiner*—Shamim Ahmed
(74) *Attorney, Agent, or Firm*—Birch, Stewart, Kolasch & Birch, LLP (57) ABSTRACT

A method for fabricating a tape substrate includes forming, on an insulating film, a copper foil pattern having a connecting area; coating a solder resist on the formed copper foil pattern, at a region other than the connecting area; plating a barrier layer on the copper foil pattern at the connecting area after the coating of the solder resist; and plating tin on the plated barrier layer plated, thereby forming a tin layer on the barrier layer. Another method for fabricating a tape substrate includes forming, on an insulating film, a copper foil pattern having a connecting area; plating a barrier layer over the formed copper foil pattern; plating tin over the barrier layer after the plating of the barrier layer, thereby forming a tin layer over the barrier layer; and coating a solder resist on the tin layer at a region other than the connecting area, after the formation of the tin layer.

6 Claims, 5 Drawing Sheets

TAPE SUBSTRATE AND METHOD FOR FABRICATING THE SAME

This application is a Divisional of U.S. application Ser. No. 10/724,219 filed on Dec. 1, 2003 now U.S. Pat. No. 7,180,006. This Nonprovisional application claims priority under 35 U.S.C. § 119(a) on Patent Application No(s). 2002-75984 filed in KOREA on Dec. 2, 2002, the entirety of each of the above-identified documents are hereby incorporated by reference.

BACKGROUND OF THE INVENTION

1. Field of the Invention

The present invention relates to a tape substrate and a method for plating the tape substrate, and more particularly to a tape substrate and a fabricating method thereof, in which tin is plated on a pattern portion of the tape substrate where an electronic element is to be mounted, without formation of pores or whiskers.

2. Description of the Related Art

Generally, tape substrates are mainly applicable to foldable electronic appliances such as an LCD panel, a portable phone, or a notebook computer. In pace with miniaturization and lightness of such electronic appliances, various substrates have been developed. For example, a tape automated bonding (TAB) substrate, a tape ball grid array (TBGA) substrate, an application specific integrated circuit (ASIC) substrate, and a chip on film (COF) substrate have been developed.

Figure 1:
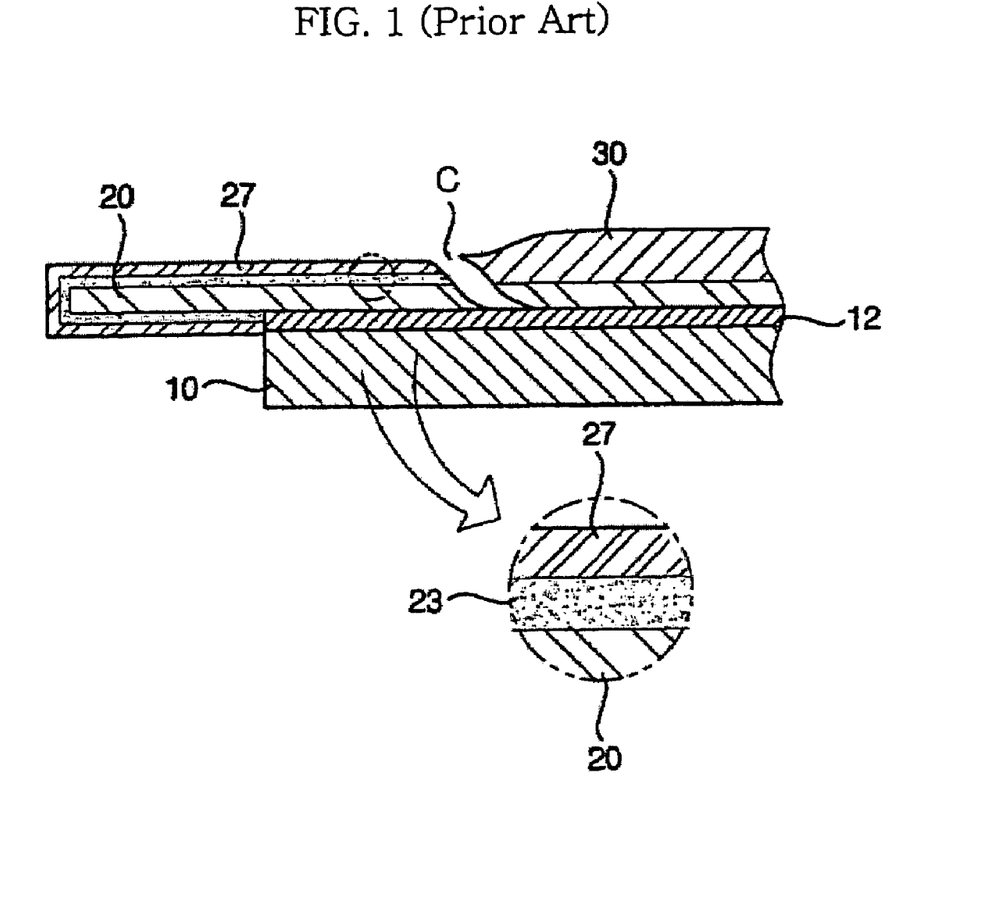
FIG. 1 is a sectional view illustrating a conventional tape substrate.

FIG. 1 is a sectional view illustrating a conventional tape substrate. This tape substrate is fabricated by bonding a copper foil, about 20 µm thick, using bonding material 12, to an upper surface of an insulating film 10 made of a material such as polyimide or polyether sulphon, coating photoresist over an upper surface of the copper foil, and then exposing the photoresist to light by use of a mask having a pattern corresponding to a desired wiring pattern, thereby transferring the wiring pattern onto the photoresist.

After the transfer of the pattern, the copper foil is subjected to an etching process, so that it is patterned to have a desired pattern. Thereafter, the photoresist is removed. Thus, a copper foil pattern 20 is completely formed.

A solder resist 30 is coated on the tape substrate formed with the copper foil pattern 20, at a region other than a connecting area, so that the surface portion of the tape substrate corresponding to the connecting area is maintained in an exposed state. Thereafter, tin is plated on the exposed surface portion of the tape substrate to form a tin layer 27 adapted to prevent oxidation from occurring at the connecting area while enabling an electronic element to be mounted on the tape substrate at the connecting area.

The plated tin layer 27 exhibits a superior flexibility, while being less toxic to the human body. The tin layer 27 also exhibits a superior solderability because its melting point is low. The tin layer 27 can also be inexpensively formed, thereby reducing the fabricating cost of the tape substrate. Furthermore, it is possible to form the tin layer 27 to have a uniform thickness of 1 µm or less. The tin plating solution adapted to form the tin layer 27 can be easily handled. In addition, the tin layer 27 exhibits a high bonding strength to bumps made of gold. By virtue of such advantages, the application of such a plated tin layer is being widened.

In accordance with the above mentioned tape substrate and fabricating method thereof, however, an electroless thin plating solution may penetrate between the edge of the solder resist 30 and the copper foil pattern 20 during a process of plating thin on the tape substrate. As a result, a local cell is formed between the copper foil and the electroless tin plating solution, so that copper may be eluted from the copper foil pattern, thereby causing voids C to be formed at the copper foil pattern. Where such a void C has a large size, open-circuit fault may be generated at the copper foil pattern 20.

Due to the void C, a bending stress is generated at the tape substrate, so that the tape substrate may be deformed. In severe cases, the tape substrate may be bent, thereby causing its copper foil pattern to be damaged.

Typically, stress may be generated at the interface between the copper foil pattern and the tin layer plated thereon, due to the hetero structures of those layers. For this reason, needle-shaped precipitates called "whiskers" may grow for several days or even several years. Such whiskers may short-circuit adjacent pattern portions of the copper foil pattern, thereby causing circuit damage. However, there is no method capable of effectively suppressing such whiskers.

A heat treatment or alloying method has often been used to suppress formation of whiskers. However, the heat treatment method requires a lengthened process time, thereby causing a degradation in productivity. Furthermore, the tape substrate may be degraded under a certain heating condition, so that it may have a poor quality. As the tin layer 27 is heated, the tin component thereof is coupled with the copper element of the copper foil pattern, thereby forming a tin-copper alloy layer 23. In order to obtain a desired thickness of a pure tin layer portion in the tin layer 27, it is necessary to perform the tin plating process for a prolonged period of time. There is also a problem in that the tin-cooper alloy layer 23 has an excessively large thickness.

Where the above alloying is carried out to suppress formation of whiskers, there is a degradation in electrical characteristics and solderability. As a result, the mounting strength for electronic elements is weakened. Thus, this method cannot basically provide a solution to the above mentioned problems.

SUMMARY OF THE INVENTION

The present invention has been made in view of the above mentioned problems, and an object of the invention is to provide a tape substrate and a fabricating method thereof, in which a barrier layer is formed prior to plating of tin in order to suppress formation of whiskers, thereby being capable of enhancing the quality and reliability of a circuit pattern formed, in the form of a highly densely integrated micro circuit pattern, at the tape substrate, preventing open-circuit fault of the pattern caused by formation of voids, achieving an increase in pattern strength in accordance with dispersion of stress, and preventing a degradation in electrical characteristics.

In accordance with one aspect, the present invention provides a tape substrate comprising: an insulating film; a copper foil pattern formed on the insulating film at one side of the insulating film, and provided with a connecting area where an electronic element is to be mounted; a barrier layer plated on the copper foil pattern at the connecting area, and formed with a plurality of pores; and a tin layer plated on the barrier layer, and alloyed with a portion of the copper foil pattern corresponding to the connecting area, through the pores.

In accordance with another aspect, the present invention provides a method for fabricating a tape substrate, comprising the steps of: (A) forming, on an insulating film, a copper foil pattern having a connecting area; (B) coating a solder resist on the copper foil pattern, formed at step (A), at a region other than the connecting area; (C) plating a barrier layer on the copper foil pattern at the connecting area after the coating of the solder resist at step (B); and (D) plating tin on the barrier layer plated at step (C), thereby forming a tin layer on the barrier layer.

In accordance with another aspect, the present invention provides a method for fabricating a tape substrate, comprising the steps of: (A) forming, on an insulating film, a copper foil pattern having a connecting area; (B) plating a barrier layer over the copper foil pattern formed at step (A); (C) coating a solder resist on the barrier layer at a region other than the connecting area, after the plating of the barrier layer at step (B); and (D) plating tin on the barrier layer at the connecting area after the coating of the solder resist at step (C), thereby forming a tin layer on the barrier layer at the connecting area.

In accordance with another aspect, the present invention provides a method for fabricating a tape substrate, comprising the steps of: (A) forming, on an insulating film, a copper foil pattern having a connecting area; (B) plating a barrier layer over the copper foil pattern formed at step (A); (C) plating tin over the barrier layer after the plating of the barrier layer at step (B), thereby forming a tin layer over the barrier layer; and (D) coating a solder resist on the tin layer at a region other than the connecting area, after the formation of the tin layer at step (C).

BRIEF DESCRIPTION OF THE DRAWINGS

The above objects, and other features and advantages of the present invention will become more apparent after reading the following detailed description when taken in conjunction with the drawings, in which.

DESCRIPTION OF THE PREFERRED EMBODIMENTS

Now, a tape substrate and fabricating method thereof according to the present invention will be described in detail with reference to the annexed drawings.

Figure 2:
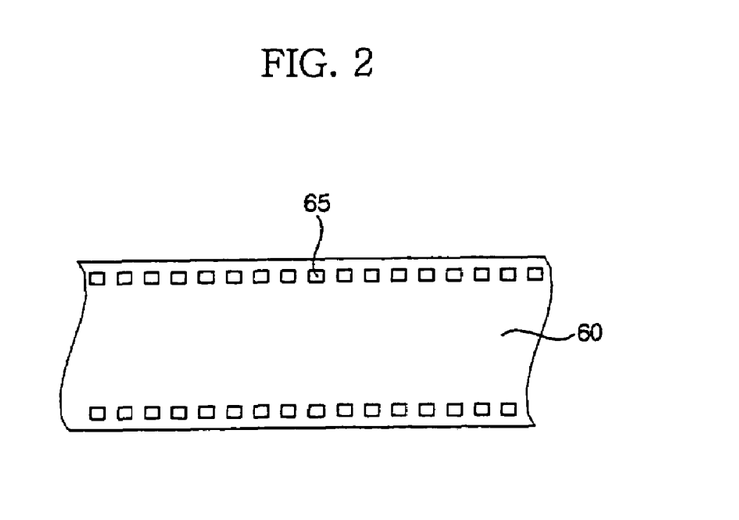
FIG. 2 is a plan view illustrating a tape substrate according to the present invention.
Figure 3:
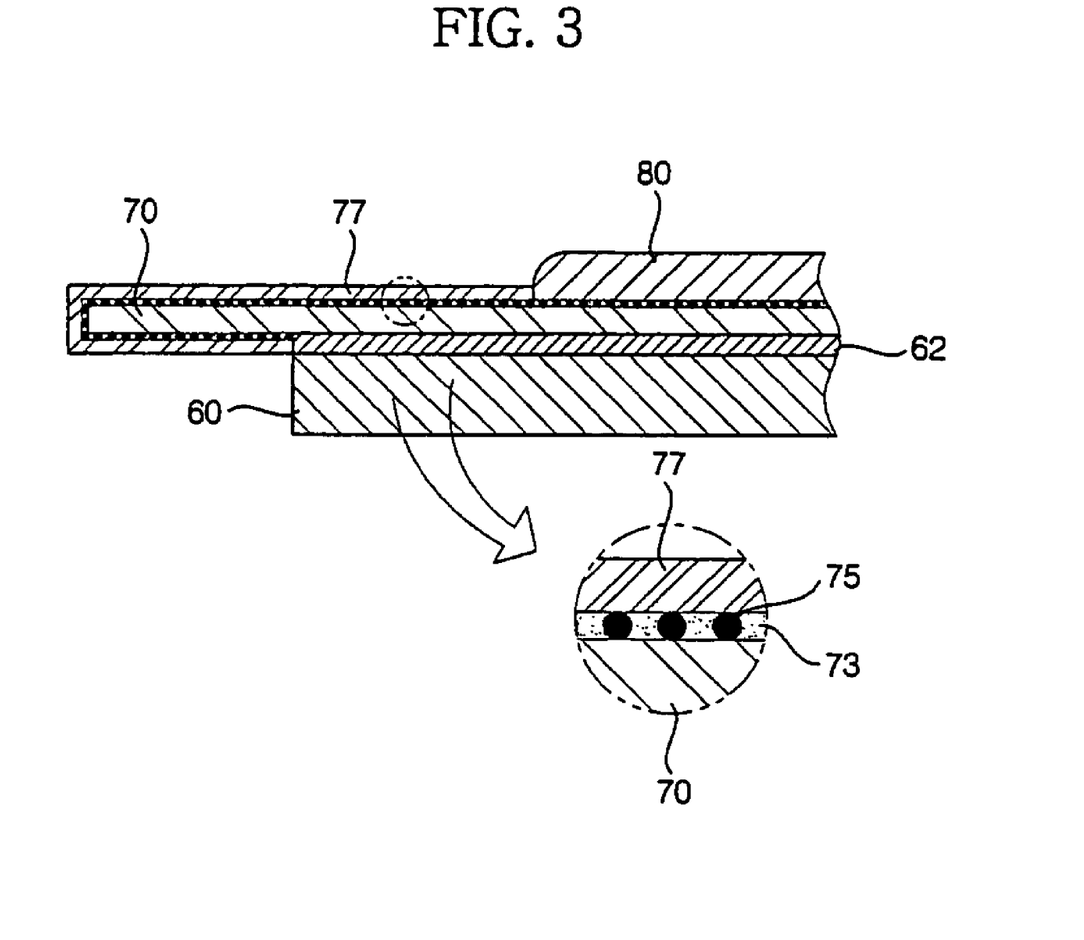
FIG. 3 is a sectional view illustrating the tape substrate according to the present invention.

FIG. 2 is a plan view illustrating a tape substrate according to the present invention. FIG. 3 is a sectional view illustrating the tape substrate according to the present invention.

As shown in FIGS. 2 and 3, the tape substrate includes an insulating film 60, a copper foil pattern 70 formed on the insulating film 60 at one side of the insulating film 60, and provided with a connecting area where an electronic element is to be mounted, a barrier layer 75 plated on the copper foil pattern 70 at the connecting area, and formed with a plurality of pores 73, and a tin layer 77 plated on the barrier layer 75. In FIG. 3, the reference numeral 80 designates a solder resist.

The tin layer 77 plated on the barrier layer 75 comes into contact with the copper foil pattern 70 via the pores. As the tin layer 77 is heated, it alloys with the copper foil pattern 70.

The insulating film 60 may be made of a plastic resin film. Preferably, the insulating film 60 is made of an chemical-resistant and heat-resistant material because it is heated in a plating process in a state of being dipped in a electroless barrier or tin plating solution.

Typically, the insulating film 60 is made of a material such as epoxy, ester, polyimide, or polyamide. In accordance with the present invention, a film made of polyimide is mainly used for the insulating film 60.

The insulating film 60 typically has a thickness of 10 to 100 μm. In a process for fabricating the tape substrate, this insulating film 60 is fed by a reel-to-reel type feeding machine. In order to accurately feed the insulating film 60 while achieving a desired alignment of the insulating film 60, a plurality of uniformly spaced alignment holes 65 are formed in an aligned fashion at the insulating film 60 along both sides of the insulating film 60, as shown in FIG. 2. The alignment holes 65 are sequentially engaged with alignment pins provided at the feeding machine during a feeding operation of the feeding machine, so as to allow the insulating film 60 to be accurately fed.

Figure 4:
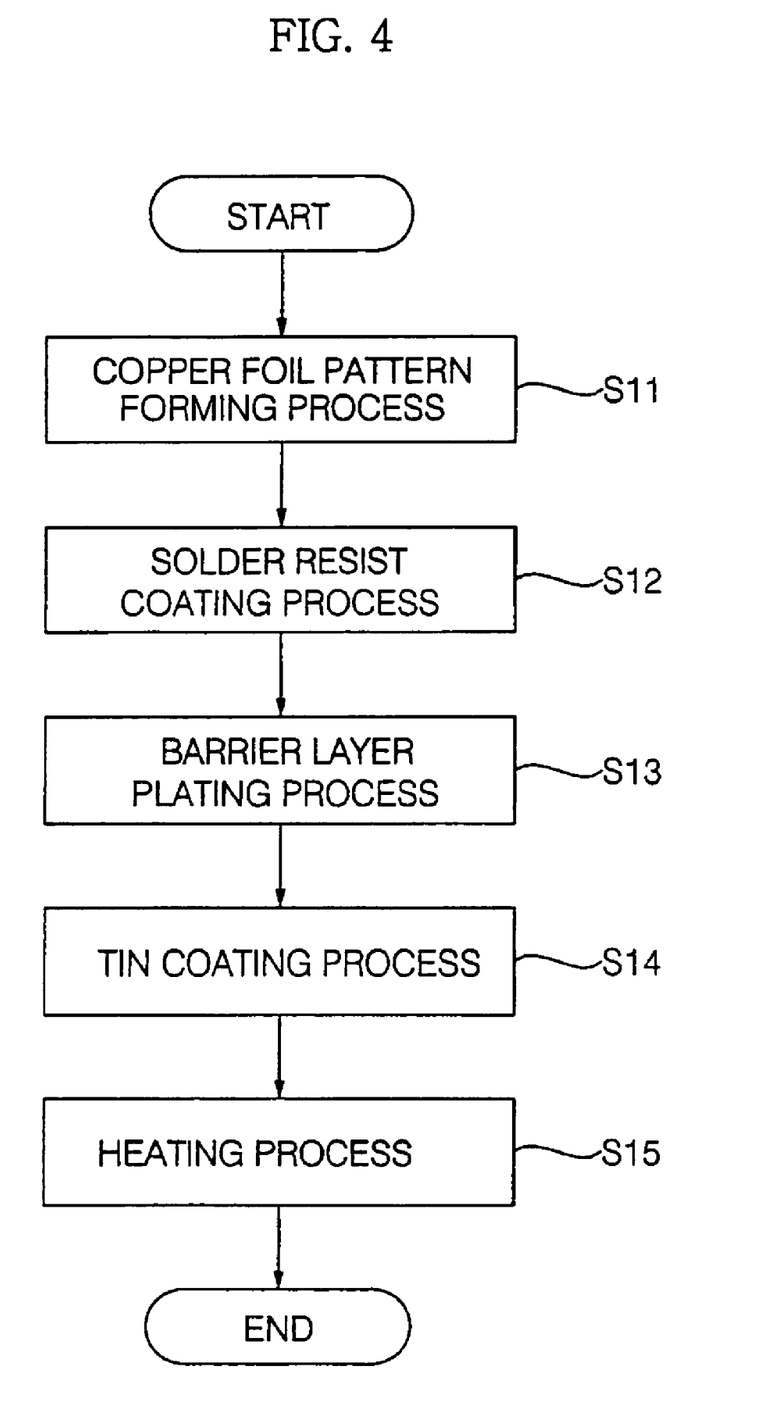
FIG. 4 is a flow chart illustrating a method for fabricating a tape substrate in accordance with an embodiment of the present invention.

FIG. 4 is a flow chart illustrating a method for fabricating the tape substrate having the above described structure in accordance with an embodiment of the present invention.

As shown in FIG. 4, this method includes first step S11 of forming, on the insulating film 60, the copper foil pattern 70 having the connecting area, second step S12 of coating the solder resist 80 on the copper foil pattern 70, formed at first step S11, at a region other than the connecting area, third step S13 of plating the barrier layer 75 on the copper foil pattern 70 at the connecting area after the coating of the solder resist 80 at second step S12, and fourth step S14 of plating the tin layer 77 on the barrier layer 75 plated at third step S13.

At first step S11, the insulating film 60 is coated with a copper foil to form the copper foil pattern 70. The copper foil may be attached to the insulating film 60 by means of an adhesive 62 having heat-resistant and chemical-resistant properties while having a certain adhesion. Alternatively, the copper foil may be formed on the insulating film 60 in accordance with an electrolytic plating process.

Typically, the copper foil formed through the electrolytic plating process has a thickness of 6 to 25 μm. Where it is desired to form a micro pattern, the copper foil is deposited through a sputtering process so that it has a small thickness.

The insulating film 60, to which the above described copper foil is attached, is then subjected to a photolithography process involving coating, exposure, development, etching, and peeling-off steps. Thus, the copper foil pattern 70 is formed on the insulating film 60.

The copper foil pattern 70 formed at first step S11 is then treated at second step S12, so as to prevent oxidation thereof and to achieve an electrical insulation thereof. At second step S12, the solder resist 80 is coated on the copper foil pattern 70.

For the solder resist 80, epoxy, polyimide, or urethane may typically be used. Preferably, the solder resist 80 is made of a material capable of being easily bonded to both the copper foil pattern 70 and the insulating film 60. Also, the solder resist 80 may be made of a thermosetting resin which can be set by ultraviolet rays or heat.

The solder resist 80 is coated on the copper foil pattern 70 at a region other than the connecting area, so as to allow an electronic element to be mounted on the connecting area. Accordingly, the coating of the solder resist 80 is carried out under the condition in which the connecting area is covered by a screen mask, in order to prevent the solder resist 80 form being coated over the connecting area.

The solder resist 80 is coated to have a thickness of 5 to 50 µm. Where the solder resist 80 is made of a thermosetting resin, it is subjected, in a coated state, to a heating process at a temperature of 120 to 160° C. for about 30 minutes or more so that it is dried.

In the process of heating the solder resist 80, bubbles may be formed at the solder resist 80. Accordingly, it is necessary to appropriately increase the heating temperature in the heating process, in order to prevent formation of bubbles while preventing a resist solvent present in the solder resist 90 from flowing toward the copper foil pattern 70, and thus, remaining on the copper foil pattern 70.

After the coating of the solder resist 80 at second step S12, the resultant structure is subjected to third step S13 for coating the barrier layer 75 on the connecting area not coated with the solder resist 80.

The barrier layer 75 is made of a compound containing gold (Au) and silver (Ag) as major components thereof. An additive such as selenium (Se) or lead (Pb) is also added to the compound in order to obtain an increased plating strength.

The plating of the barrier layer 75 is carried out in accordance with an electroless plating process using an electroless barrier plating solution. The electroless barrier plating solution may have a composition consisting of 0.01 to 5 wt % of soluble Au, 0.1 to 5 wt % of soluble Ag, 0.1 to 20 wt % of KCN or NaCN, 0.1 to 20 wt % of imidazole or imidazole derivative, 0.1 to 20 wt % a nonionic surfactant, and 0.1 to 20 wt % of a glycine/EDTA/chelate agent.

The barrier layer 75 electroless-plated using the above electroless barrier plating solution has a thickness of 0.01 to 1 µm. Preferably, the barrier layer 75 has a thickness of 0.05 to 0.5 µm.

Where the barrier layer 75 is excessively thick, the time taken to carry out a subsequent tin plating process increases. On the other hand, where the barrier layer 75 is excessively thin, the layer formed as the plated tin is alloyed with the copper foil has an excessively large thickness. Accordingly, the barrier layer 75 should have an appropriate thickness determined in accordance with a finally-required thickness of the tin layer 77.

The barrier layer 75 is plated in the form of dots, so that it has a number of pores. In accordance with the present invention, the barrier layer 75 has a pore density corresponding to less than 95% of the surface area of the copper foil pattern 70, preferably not less than 50% of the surface area of the copper foil pattern 70.

At fourth step S14, tin is plated on the barrier layer 75 in accordance with an electroless tin plating process to form the tin layer 77. In the electroless tin plating process carried out on the barrier layer 75 plated at third step S13, substitution between the copper component of the copper foil and the tin component of the electroless tin plating solution is carried out, so that the tin layer 77 is formed.

The electroless tin plating solution may have a composition consisting of 1 to 30 wt % of methane sulfonic acid, 1 to 30 wt % of tin methane sulfonate, 1 to 30% of thiourea, 0.1 to 10 wt % a nonionic surfactant, 0.1 to 20 wt % of a carboxylic acid, and 0.1 to 20 wt % of an aromatic amine.

The tin layer 77 electroless-plated using the above electroless tin plating solution has a thickness of 0.01 to 1 µm. Preferably, the tin layer 77 has a thickness of 0.05 to 0.5 µm.

Thereafter, fifth step S15 is carried out. At fifth step S15, a heating process is performed so that a tin (Sn)-copper (Cu) alloy layer is formed at the interface between the barrier layer 75 and the tin layer 77.

In the heating process, substitution between the copper component of the copper foil pattern 70 exposed through the pores of the barrier layer 75 and the tin component of the electroless tin plating solution penetrated into the pores of the barrier layer 75 is carried out, thereby forming the tin-copper alloy layer at each pore. The pure tin layer 77 is present on the tin-copper alloy layer.

Since the tin-copper alloy layer 83 is formed at each pore of the barrier layer 75, it is present in the same layer as the barrier layer 75 in a state of being interconnected with the barrier layer 75.

Since the tin-copper alloy layer 83 is formed at each pore of the barrier layer 75, it is possible to suppress generation of internal stress in the tin layer 77. Accordingly, the possibility of formation of whiskers is reduced. It is also possible to plate the tin layer 77 to a desired thickness within a reduced time.

With the provision of the barrier layer 75, the contact area between the electroless tin plating solution and the copper foil pattern 70 is reduced. Accordingly, the plating time can be reduced. It is also possible to prevent an open-circuit fault caused by an excessive substitution between the copper foil pattern 70 and the electroless tin plating solution.

Connecting electrodes of an electronic element are mounted on the copper foil pattern 70 plated with tin as described above. The connecting electrodes are typically made of gold. The material of the connecting electrodes is coupled with the tin component of the tin layer 77, so that they are alloyed in the form of an eutectic alloy. Accordingly, the connecting electrodes are firmly bonded to the copper foil pattern 70.

Although the tape substrate and the fabricating method thereof according to the present invention have been described with reference to the annexed drawings, the present invention is not limited thereto. Those skilled in the art will appreciate that various modifications, additions and substitutions are possible, without departing from the scope and spirit of the invention.

Figure 5:
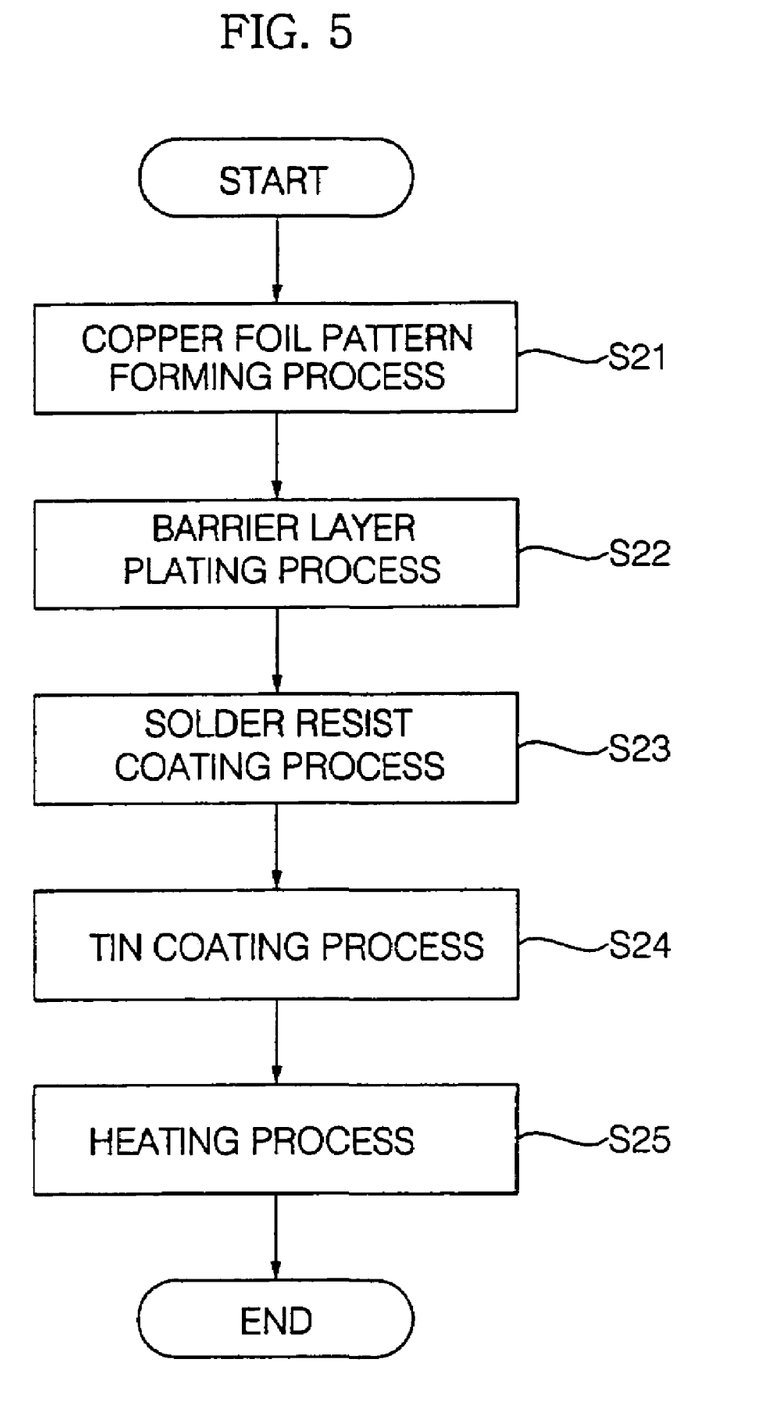
FIG. 5 is a flow chart illustrating a method for fabricating a tape substrate in accordance with another embodiment of the present invention.

For example, the process sequence of the tape substrate fabricating method may be changed. In this connection, FIG. 5 is a flow chart illustrating a method for fabricating the tape substrate in accordance with another embodiment of the present invention. As shown in FIG. 5, this method includes the steps of forming, on an insulating film, a copper foil pattern having a connecting area (S21), plating a barrier layer over the copper foil pattern (S22), and coating a solder resist on the barrier layer at a region other than the connecting area, for prevention of oxidation and achievement of electrical insulation (S23).

After the coating of the solder resist on the barrier layer at the region other than the connecting area, formation of a tin layer is carried out by plating tin on an exposed portion of the barrier layer plated on the connecting area (S24).

The tape substrate fabricating method of this embodiment is different from that of the above described embodiment in that the sequence of the processes of forming the solder resist and barrier layer is changed. Thus, it is possible to change the sequence of the solder resist and barrier layer forming processes.

Thereafter, a heating process is carried out (S25), in order to form a tin (Sn)-copper (Cu) alloy layer at the interface between the barrier layer and the tin layer.

Figure 6:
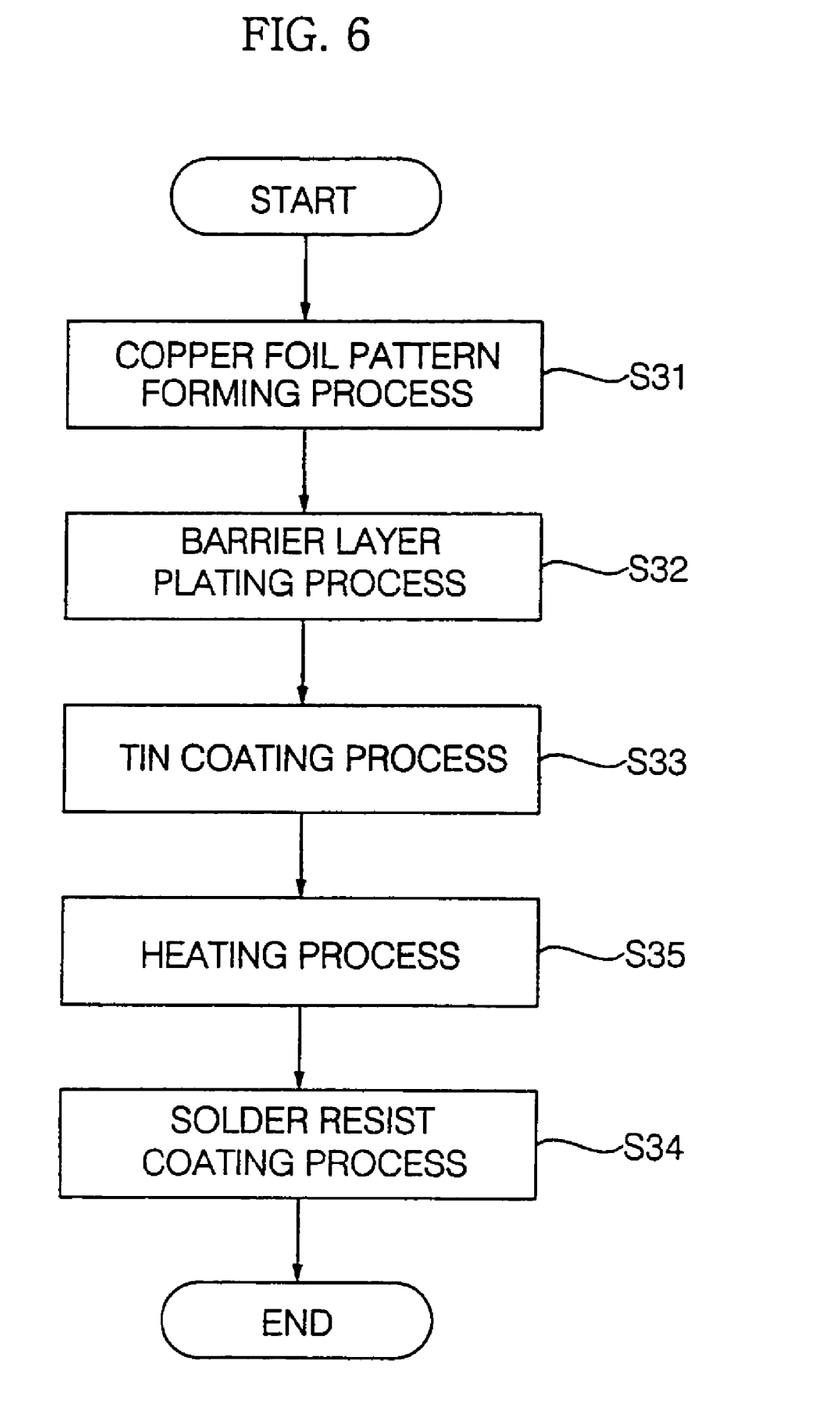
FIG. 6 is a flow chart illustrating a method for fabricating a tape substrate in accordance with another embodiment of the present invention.

FIG. 6 is a flow chart illustrating a method for fabricating the tape substrate in accordance with another embodiment of the present invention. As shown in FIG. 6, this method includes the steps of forming, on an insulating film, a copper foil pattern having a connecting area (S31), plating a barrier layer over the copper foil pattern (S32), and plating tin to form a tin layer on the barrier layer (S33).

After the tin plating, a solder resist is coated on the barrier layer at a region other than the connecting area, for prevention of oxidation and achievement of electrical insulation (S34).

After the plating of the tin layer, but before the coating of the solder resist, a heating process is carried out (S35), in order to form an alloy layer at the interface between the barrier layer and the tin layer.

Hereinafter, the present invention will be described in conjunction with various examples. These examples are made only for illustrative purposes, and the present invention is not to be construed as being limited to those examples.

EXAMPLE 1

A copper foil pattern having a thickness of 18 µm was formed on a polyimide film. Thereafter, a barrier layer having a thickness of 0.1 µm was formed over the entire upper surface of the copper foil pattern. Subsequently, a solder resist was printed to a thickness of 30 µm over the barrier layer, and then thermally set at a temperature of 150° C. for 60 minutes. A tin layer was then formed over the barrier layer in a tin plating bath maintained at 65° C. In accordance with these processes, tape substrates having different tin layer thicknesses of 0.2 µm, 0.3 µm, and 0.4 µm, respectively, were fabricated. Any of the tape substrates did not exhibit voids and whiskers at the boundary of the solder resist. Even after being aged for seven days, any of the tape substrates did not exhibit whiskers even after being aged for seven days.

EXAMPLE 2

A copper foil pattern having a thickness of 18 µm was formed on a polyimide film. Thereafter, a solder resist was printed to a thickness of 30 µm on the upper surface of the copper foil pattern at a region other than a connecting area, and then thermally set at a temperature of 150° C. for 60 minutes. Thereafter, a barrier layer having a thickness of 0.1 µm was formed on the copper foil pattern. A tin layer was then formed over the barrier layer in a tin plating bath maintained at 65° C. In accordance with these processes, tape substrates having different tin layer thicknesses of 0.1 µm, 0.2 µm, and 0.3 µm, respectively, were fabricated. Any of the tape substrates did not exhibit voids and whiskers at the boundary of the solder resist. Even after being aged for seven days, any of the tape substrates did not exhibit whiskers.

EXAMPLE 3

A copper foil pattern having a thickness of 18 µm was formed on a polyimide film. Thereafter, a solder resist was printed to a thickness of 30 µm on the upper surface of the copper foil pattern at a region other than a connecting area, and then thermally set at a temperature of 150° C. for 60 minutes. Thereafter, a barrier layer having a thickness of 0.1 µm was formed on the copper foil pattern. A tin layer was then formed over the barrier layer in a tin plating bath maintained at 65° C. In accordance with these processes, tape substrates having different tin layer thicknesses of 0.2 µm, 0.3 µm, and 0.4 µm, respectively, were fabricated. After the formation thereof, the tin layer was dried at a temperature of 120° C. for 120 minutes. All tape substrates exhibited excellent characteristics.

EXAMPLE 4

A copper foil pattern having a thickness of 18 µm was formed on a polyimide film. Thereafter, a solder resist was printed to a thickness of 30 µm on the upper surface of the copper foil pattern at a region other than a connecting area, and then thermally set at a temperature of 150° C. for 60 minutes. Thereafter, a barrier layer having a thickness of 0.1 µm was formed on the copper foil pattern. A tin layer was then formed to a thickness of 0.1 µm over the barrier layer in a tin plating bath maintained at 65° C. After the formation thereof, the tin layer was dried at a temperature of 120° C. for 120 minutes. A secondary tin plating process was subsequently carried out to obtain a pure tin layer having a thickness of 0.1 µm. The resultant tape substrate did not cause any problem.

In the electroless tin plating process in the above examples, for formation of an optimal barrier layer, each tape substrate formed with the copper foil pattern was acid-cleaned at 45° C. for 60 seconds in a solution containing sulphuric acid ($H_2SO_4$) as a major component thereof, and washed by pure water at normal temperature. The tape substrate was also subjected to a micro etching process for removal of an oxide film from the surface of the copper foil pattern, and then washed. After these processes, the formation of the barrier layer was carried out. The tin plating process was carried out using a tin plating solution containing 15% of methane sulfonic acid (MSA) for surface polish. The plated tin layer was washed at 45° C. for 30 seconds, and then dried.

In the case in which the barrier plating process and the tin plating process are separately carried out, the above described process conditions may be used without any substantial modification thereof.

As apparent from the above description, in accordance with the tape substrate of the present invention and the fabricating method thereof, a barrier layer having a plurality of pores is formed at the connecting area of a copper foil pattern, so that a tin layer plated over the barrier layer is alloyed with the copper foil pattern at the connecting area through the pores. In accordance with the present invention, it is possible to reduce the time taken for the copper foil pattern to come into contact with the electroless tin plating solution used in the tin plating process, thereby preventing the copper component of the copper foil pattern from being eluted. Accordingly, there is no open-circuit fault caused by formation of pores. The barrier layer makes it possible to obtain an improved plating efficiency and to reduce the thickness of the alloy layer. As a result, formation of the pure tin layer is easily achieved, thereby enabling a reduction in the process time, and thus, an increase in yield. Also, it is possible to reduce the thickness of the copper foil pattern. This provides an advantage in association of the formation of micro circuit patterns.

In addition, the barrier layer serves to reduce internal stress generated at the interface between the tin layer and the copper foil pattern, thereby suppressing formation of voids. Accordingly, there is an effect of preventing a short circuit caused by the growth of whiskers.

By virtue of the barrier layer, it is also possible to reduce a variation in electrical characteristics caused by hetero metal layers. Since it is unnecessary to use a separate process for preventing formation of whiskers, the process time and costs can be reduced.

What is claimed is:

1. A method for fabricating a tape substrate, comprising the steps of:
   (A) forming, on an insulating film, a copper foil pattern having a connecting area;
   (B) coating a solder resist on the copper foil pattern, formed at step (A), at a region other than the connecting area;
   (C) plating a barrier layer in the form of dots on the copper foil pattern at the connecting area after the coating of the solder resist at step (B); and
   (D) plating tin on the barrier layer plated at step (C), thereby forming a tin layer on the barrier layer.

2. The method according to claim 1, further comprising the step of:
   heating the barrier layer and the tin layer after the plating of the tin layer at step (D), thereby alloying the barrier layer and the tin layer at an interface therebetween.

3. A method for fabricating a tape substrate, comprising the steps of:
   (A) forming, on an insulating film, a copper foil pattern having a connecting area;
   (B) plating a barrier layer in the form of dots over the copper foil pattern formed at step (A);
   (C) coating a solder resist on the barrier layer at a region other than the connecting area, after the plating of the barrier layer at step (B); and
   (D) plating tin on the barrier layer at the connecting area after the coating of the solder resist at step (C), thereby forming a tin layer on the barrier layer at the connecting area.

4. The method according to claim 3, further comprising the step of:
   heating the barrier layer and the tin layer after the plating of the tin layer at step (D), thereby alloying the barrier layer and the tin layer at an interface therebetween.

5. A method for fabricating a tape substrate, comprising the steps of:
   (A) forming, on an insulating film, a copper foil pattern having a connecting area;
   (B) plating a barrier layer in the form of dots over the copper foil pattern formed at step (A);
   (C) plating tin over the barrier layer after the plating of the barrier layer at step (B), thereby forming a tin layer over the barrier layer; and
   (D) coating a solder resist on the tin layer at a region other than the connecting area, after the formation of the tin layer at step (C).

6. The method according to claim 5, further comprising the step of:
   heating the barrier layer and the tin layer after the plating of the tin layer at step (C), thereby alloying the barrier layer and the tin layer at an interface therebetween.

* * * * *